United States Patent
Kazmierowicz et al.

(10) Patent No.: US 10,887,946 B2
(45) Date of Patent: Jan. 5, 2021

(54) SENSOR SYSTEM UPGRADE KIT FOR CONVEYORIZED OVEN

(71) Applicants: Casimir Walter Kazmierowicz, Ramona, CA (US); Philip Casimir Kazmierowicz, Estacada, OR (US)

(72) Inventors: Casimir Walter Kazmierowicz, Ramona, CA (US); Philip Casimir Kazmierowicz, Estacada, OR (US)

(73) Assignee: Embedded Designs, Inc., San Diego, CA (US)

( * ) Notice: Subject to any disclaimer, the term of this patent is extended or adjusted under 35 U.S.C. 154(b) by 279 days.

(21) Appl. No.: 16/155,928

(22) Filed: Oct. 10, 2018

(65) Prior Publication Data

US 2020/0120757 A1 Apr. 16, 2020

(51) Int. Cl.
| | |
|---|---|
| *H05B 1/02* | (2006.01) |
| *G01K 1/08* | (2006.01) |
| *G01K 13/00* | (2006.01) |
| *H05K 3/00* | (2006.01) |
| *F27D 21/02* | (2006.01) |
| *G01K 7/02* | (2006.01) |
| *F27D 19/00* | (2006.01) |

(52) U.S. Cl.
CPC ............ *H05B 1/0233* (2013.01); *G01K 1/08* (2013.01); *G01K 13/00* (2013.01); *H05K 3/0085* (2013.01); *F27D 2019/0003* (2013.01); *F27D 2021/026* (2013.01); *G01K 7/021* (2013.01); *H05K 2203/0195* (2013.01); *H05K 2203/163* (2013.01)

(58) Field of Classification Search
CPC ........ H05B 1/0233; G01K 1/08; G01K 13/00; G01K 7/021; G01K 7/22; G01K 7/02; G01K 7/028; H05K 3/0085; H05K 2203/163; H05K 2203/0195; F27D 2021/026; F27D 2019/0003; F27D 21/0014; F27B 9/40; F27B 17/0025; F26B 15/18; F26B 25/00; G01J 5/12; G01J 5/046; G01J 5/00; G01J 5/04; G01J 5/08; G01J 5/16; G01J 5/089; G01J 5/0066; G01J 5/0096; G01J 5/0225; G01J 5/022; G01J 5/024; G01J 5/0806; H01L 35/32; H01L 35/34; H01L 21/67109; H01L 21/67115; H01L 21/67138; H01L 21/67173; H01L 21/677; H01L 21/6776; A21B 1/40; A21B 1/48; A21B 1/33; A21B 1/46; A21B 1/44
See application file for complete search history.

(56) References Cited

U.S. PATENT DOCUMENTS

| | | | |
|---|---|---|---|
| 8,087,407 B2 * | 1/2012 | Wiker | A21B 1/40 126/21 A |
| 2012/0181265 A1 * | 7/2012 | Menard | F27B 9/066 219/388 |

\* cited by examiner

*Primary Examiner* — Shawntina T Fuqua (57) ABSTRACT

A kit for retrofitting an oven processing system can be used to upgrade temperature monitoring capability. The oven processing system includes an oven and a conveyor belt. The oven defines a heated tunnel. The conveyor belt travels through the tunnel along a lateral axis. The kit at least includes a plurality of sensor modules. The sensor modules are elongate bodies with a sensing end that is mounted inside the oven. The sensor modules individually include a gas conduit and an electrical cable. The gas conduit is coupled to a pressurized source of gas. The electrical cable is coupled to a data acquisition unit that is located outside of the heated tunnel.

19 Claims, 11 Drawing Sheets

FIG. 1

FIG. 2: UPGRADE KIT

SENSOR SYSTEM UPGRADE KIT FOR CONVEYORIZED OVEN

FIELD OF THE INVENTION

The present disclosure relates to zone ovens for processing substrates such as printed circuit boards. More particularly, the present disclosure concerns a sensor system upgrade kit for installing sensors in a tunnel oven that are self-calibrating and insensitive to contamination generated from the substrates being processed.

BACKGROUND

High temperature zone ovens are in wide use. A typical zone oven has a heated tunnel with a conveyor belt that passes through the tunnel at a controlled speed. Most zone ovens have temperature monitoring capability for the oven, but not necessarily for objects being processed by the oven. There is a desire to provide continuous monitoring of parts being processed by the oven. This is sometimes done by passing a temperature probe through the oven on the conveyor belt, but this is not practical for constant monitoring.

One challenge with sensor systems is the high temperature and contamination inside the oven. This is particularly true with ovens used to reflow solder. The temperatures can damage the electronics of typical non-contact sensors. Oven temperatures can exceed 200 degrees Celsius. Some oven temperatures can exceed 250 or even 300 degrees Celsius. Also, the solder flux can deposit on sensor components which can reduce accuracy. There is a need to provide a monitoring system that can be used to upgrade older ovens, survive these temperatures, and is not sensitive to contamination.

SUMMARY

In a first aspect of the disclosure, an oven processing system includes an oven, a conveyor belt, and a measurement system. The oven has a heated tunnel passing therethrough. The conveyor belt travels laterally through the tunnel along a first X-axis. The measurement system includes a plurality of sensor modules, a data acquisition unit, and a source of pressurized gas. The sensor modules individually include an enclosure, a housing, a gas conduit, and an electrical cable. The enclosure contains a substrate and a thermopile lens. The substrate has a first side and a second side. The first side of the substrate has a thermopile configured to output a first signal indicative of a surface temperature of an object on the conveyor belt relative to the temperature of the substrate. The second side of the substrate has a temperature sensor configured to output a second signal indicative of a temperature of the substrate. The thermopile lens overlays the thermopile. The enclosure defines an opening that overlies the thermopile lens to allow infrared light to enter the opening and to reach the thermopile. The housing encloses the enclosure and includes an opening aligned with the thermopile lens to allow infrared light from the object to reach the thermopile. The gas conduit is fluidically coupled to the housing. The electrical cable is electrically coupled to the substrate. The data acquisition unit is coupled electrically to the electrical cable and thereby receives the first and second signals from the sensor modules and outputs information indicative of a surface temperature of the object. The source of pressurized gas is coupled to the gas conduit whereby gas flows through the conduit, to the housing, and out the opening in the housing. The flow through the opening in the housing prevents an accumulation of contaminants upon the thermopile lens.

The sensor modules individually have an elongate body including proximal and distal ends. The distal end includes the enclosure and the housing which are temperature insensitive. The distal end is mounted in the heated tunnel. The proximal end is located outside of the heated tunnel where it is coupled to the sensor electronics (data acquisition unit) and the source of pressurized gas. The sensor electronics are temperature sensitive. Thus, an elongate architecture of the sensor modules allow a physical and spatial separation between the temperature insensitive distal end and the temperature sensitive sensor electronics.

In one implementation the oven processing system has been upgraded with a kit. The kit at least includes the plurality of sensor modules. The kit can also include the sensor electronics (data acquisition unit) and the source of gas.

In another implementation a distal end of the sensor module includes the housing. The distal end is mounted adjacent to an edge of the conveyor belt within the tunnel of the oven. The thermopile lens generally faces a location of an upper surface of the object upon the conveyor belt or an upper surface of the conveyor belt. The thermopile lens has an optical axis that is aligned downwardly and along a second lateral axis transverse to the first axis. The optical axis defines an oblique angle with respect to the second lateral axis and to a third vertical axis.

In a second aspect of the disclosure, a method of retrofitting an oven processing system provides an enhanced way to monitor surface temperatures of objects being processed. The oven processing system includes an oven and a conveyor belt. The oven defines a heated lateral tunnel. The conveyor belt travels through the heated tunnel along a first lateral axis. The method includes mounting a plurality of sensor modules in the oven processing system. The plurality of sensor modules individually include an enclosure, a housing, a gas conduit, and an electrical cable. The enclosure contains a substrate and a thermopile lens. The substrate has a first side and a second side. The first side of the substrate has a thermopile configured to output a first signal indicative of a surface temperature of an object on the conveyor belt relative to the temperature of the substrate. The second side of the substrate has a temperature sensor configured to output a second signal indicative of a temperature of the substrate. The thermopile lens overlays the thermopile. The enclosure defines an opening that overlies the thermopile lens to allow infrared light to enter the opening and to reach the thermopile. The gas conduit is coupled to the housing. The electrical cable is coupled to the substrate.

The sensor modules individually have an elongate body including a distal end and a proximal end. The distal end includes the enclosure and the housing. The distal end is mounted in the heated tunnel. The proximal end is coupled to a source of pressurized gas and to a data acquisition unit outside of the heated tunnel. Together, the sensor modules the data acquisition unit are a measurement system. This design of the sensor module separates a temperature insensitive portion (the distal end) from the temperature sensitive portion (the electronics of the data acquisition unit). The temperature insensitive end is placed in the heated tunnel while the temperature sensitive end is protected from heat damage by placement outside of the heated tunnel.

In one implementation the sensor modules include a distal end that includes the enclosure and the housing. The method of retrofitting includes mounting the distal end at a location that is adjacent to an edge of the conveyor belt within the lateral tunnel. The distal end is mounted such that the thermopile lens is in a generally facing relation with an upper surface of the conveyor belt.

In a third aspect of the disclosure, a kit for retrofitting an oven processing system can be used to upgrade temperature monitoring of objects being processed. The oven processing system includes an oven and a conveyor belt. The oven defines a heated laterally extending tunnel. The conveyor belt travels through the heated tunnel along a first lateral axis. The kit at least includes a plurality of sensor modules. The sensor modules individually and integrally include an enclosure, a housing, a gas conduit, and an electrical cable. The enclosure contains a substrate and a thermopile lens. The substrate has a first side and a second side. The first side of the substrate has a thermopile configured to output a first signal indicative of a surface temperature of an object on the conveyor belt relative to the temperature of the substrate. The second side of the substrate has a temperature sensor configured to output a second signal indicative of a temperature of the substrate. The thermopile lens overlays the thermopile. The enclosure defines an opening that overlies the thermopile lens to allow infrared light to enter the opening and to reach the thermopile. The housing encloses the enclosure and defines an opening aligned with the thermopile lens to allow infrared light from the object to reach the thermopile. The gas conduit is coupled to the housing. The electrical cable is coupled to the substrate.

In one implementation the kit can include a data acquisition unit (sensor electronics). The sensor modules coupled to the data acquisition unit provide a measurement system. The data acquisition unit is the electronics portion of the measurement system and is temperature sensitive. The sensor modules individually have an elongate body having a distal end and a proximal end. The distal end is temperature insensitive and includes the enclosure and the housing and is configured to be mounted within the heated tunnel. The proximal end is configured to be attached to the temperature sensitive electronics outside of the heated tunnel. Thus, the measurement system has an architecture whereby the temperature insensitive portions can be placed in the heated tunnel while the temperature sensitive portion(s) can be placed outside of the heated tunnel.

In another implementation, the sensor modules individually include a support upon which the enclosure is mounted. The support is contained within the housing. The support has mutually orthogonal major, intermediate, and minor axes. The support has a first side and a second side. The second side defines a recess upon which the enclosure is mounted. The enclosure has a first side and second side which face in the same directions as the first and second sides of the support respectively. Electrical leads emerge from the second side of the enclosure and route along the long axis of the support within the recess and are coupled to the electrical cable. The support defines an opening that passes from the first side to the recess and is aligned with the thermopile lens. The optical axis of the thermopile lens is generally aligned with openings in the enclosure, the support, and the housing so that infrared light can pass through the housing, support, and the enclosure to reach the thermopile lens and then the thermopile. The support includes two threaded openings for mounting within the oven. The housing includes two openings that are aligned with the threaded openings. The kit includes a mounting component that attaches to the oven. When the support is mounted to the oven, screws pass through the openings in the housing that overlay the threaded openings to attach the support to the mounting component. Tightening the screws seals the openings in the housing. The enclosure and the threaded openings are generally arranged along the major axis of the support.

In yet another implementation the electrical cable passes through at least part of the gas conduit between the housing and a data acquisition unit. At least a portion of the gas conduit provides a dual function of routing the electrical cable and transporting pressurized gas to the housing. The sensor module can include a junction. The gas conduit includes a first conduit portion between the housing and the junction, and a second conduit portion between the junction and a source of pressurized gas. The electrical cable splits off from the gas carrying conduit at the junction. The junction can be a T-junction. The electrical cable passes straight through the T-junction. The second conduit portion emerges from the junction at a right angle to the first conduit portion. The electrical cable therefore passes through the first conduit portion but not through the second conduit portion.

In a further implementation, the kit includes one or more of a source of pressurized gas and a data acquisition unit. The kit can also include software stored on a non-volatile medium for analyzing information from the data acquisition unit. The kit may include yet other elements that facilitate retrofitting of the oven processing system such as mounting accessories and screws.

DETAILED DESCRIPTION OF THE PREFERRED EMBODIMENTS

Figure 1:
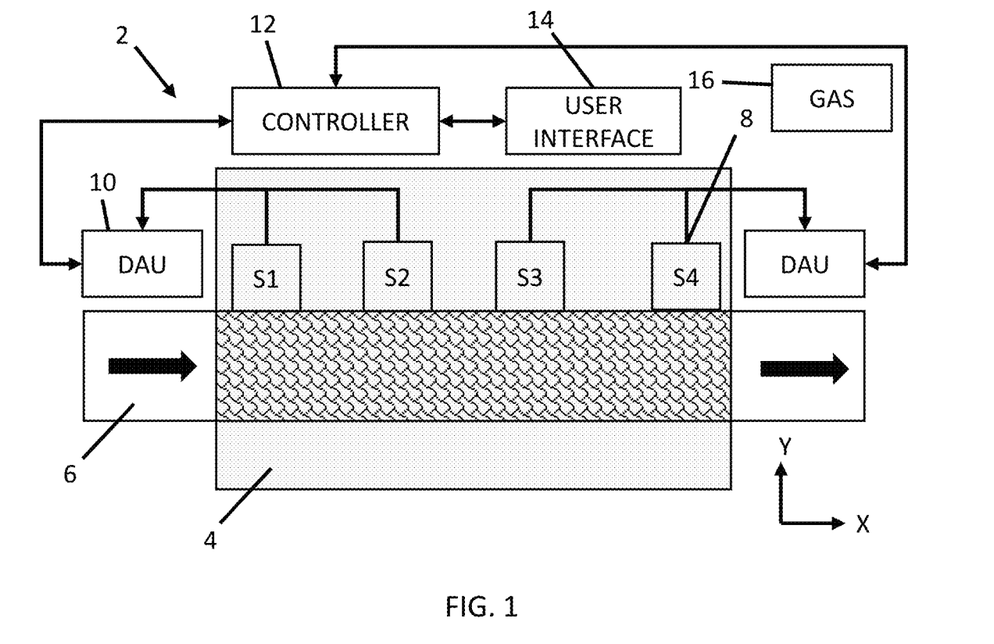
FIG. 1 is a schematic block diagram of an embodiment of an oven processing system.

FIG. 1 is a schematic block diagram of an embodiment of an oven processing system 2. The oven processing system 2 includes a zone oven 4 that defines a heated tunnel extending laterally therethrough. A conveyor belt 6 passes through the tunnel (within the tunnel) and is configured to travel laterally through the tunnel to carry objects to be processed by system 2.

In describing directions in this system, mutually perpendicular axes X, Y, and Z can be used. The axes X and Y are lateral axes that are generally horizontal. The axis Z is a vertical axis that is generally aligned with a gravitational reference. By "generally aligned" we mean that these are aligned to within typical mechanical tolerances of manufacturing and locating the oven processing system 2. The direction X or a first direction, is a direction of movement of the conveyor 6 through the oven 4. The direction Y or a second direction, is a lateral direction that is transverse to the conveyor belt motion. The vertical direction Z can be referred to as a "third direction."

The system 2 includes a plurality of sensor modules 8 that are partially disposed in the tunnel of the oven 4. Sensor modules 8 (otherwise labeled in FIG. 1 as S1-S4) are coupled to one or more data acquisition units 10. Data acquisition units 10 receive signals from sensor modules 8 and process the signals to output signals or data that is indicative of a surface temperature of objects traveling along the conveyor belt 6. The data acquisition units 10 are coupled to a controller 12 that analyzes information from the data acquisition units 10 and displays it on a user interface 14. The data acquisition unit 10 can also be referred to as sensor electronics 10.

The data acquisition units 10 are located outside of the oven 4. The data acquisition units 10 contain components that are temperature sensitive and would be damaged inside the heated tunnel of oven 4. The portions of sensor modules 8 that are inside oven 4 are resistant to temperatures in the hottest zones of oven 4.

In some embodiments, the controller 12 and user interface 14 are an integrated unit such as an embedded computer, a separate computer, or a mobile device. While only four sensors 8 are illustrated, the number can vary and can be any practical number. In one illustrative embodiment, the oven 4 has three zones and there are three sensor modules 8 for each zone or a total of nine sensor modules. In another embodiment, the oven includes both heating and cooling zones. In yet another embodiment, there are twelve sensor modules 8. In the illustrative embodiment there are two data acquisition units 10 shown in order to reduce a length of the sensor modules 8. However, in some embodiments, there can be a single data acquisition unit 10 to which all the sensors are routed.

System 2 also includes a source of pressurized gas 16 which is coupled to the sensor modules 8. The source of pressurized gas 16 can output air or an inert gas such as nitrogen. The delivery of the gas to the sensor modules 8 prevents a build-up of contamination upon the sensor modules 8 that would otherwise reduce an ability to accurately sense surface temperatures.

Figure 2:
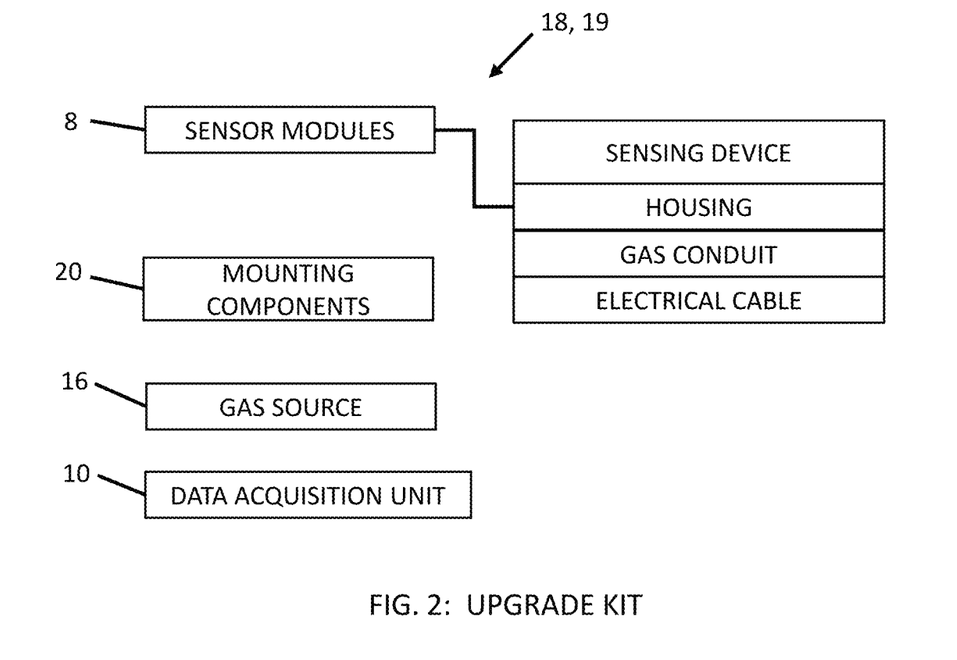
FIG. 2 is a diagram depicting an embodiment of a field upgrade kit used to retrofit an oven processing system with a non-contact surface temperature measurement and monitoring system. A "field" upgrade kit can be installed at a location of an existing oven.

FIG. 2 depicts an embodiment of a field upgrade kit 18 for providing enhanced temperature sensing capabilities to an oven processing system 2. The field upgrade kit provides components of a measurement system 19. Field upgrade kit includes sensor modules 8, mounting components 20, source of pressurized gas 16, and data acquisition unit 10. The sensor modules 8 individually include a sensing device, a housing, a gas conduit, and an electrical cable which will be discussed in more detail infra. A mounting component 20 is used to mount a distal end of a sensor module 8 within the oven 4.

The sensor modules 8 have elongate bodies with a distal end and proximal ends. The distal end includes the sensing device and the housing. The proximal ends include ends of the gas conduit and electrical cable. The gas conduit and electrical cable extend between the distal end and the proximal ends. The elongate body sensor module architecture allows a physical separation of the data acquisition unit 10 (temperature sensitive measurement system electronics) from the distal end (temperature insensitive sensing device and housing).

The source of pressurized gas 16 can take on any number of forms. In one embodiment the source of pressurized gas 16 includes a regenerative blower for pressurizing and transporting air. In another embodiment, the source of pressurized gas 16 includes a nitrogen generator for providing pressurized nitrogen to the sensor modules 8. In yet other embodiments, the source of pressurized gas can be a source of inert gas such as a pressurized bottle of inert gas such as argon or nitrogen.

Figure 3A:
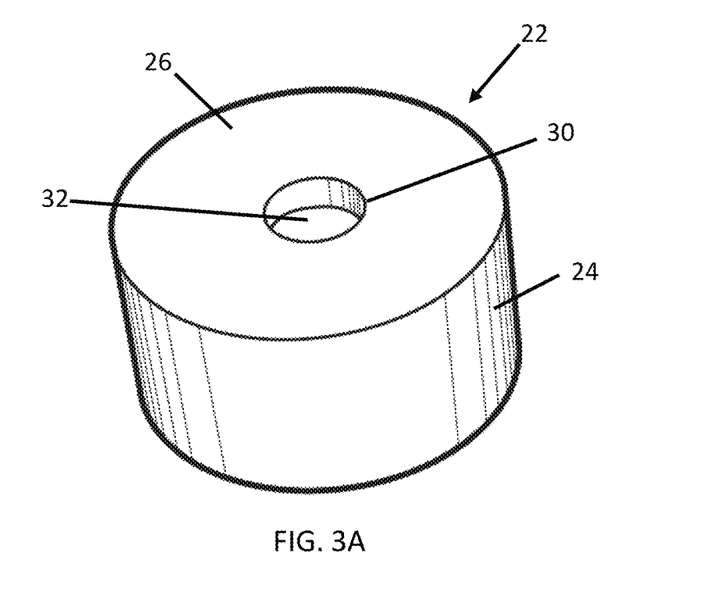
FIG. 3A is an isometric illustration of a sensing device with a particular illustration of a first side of an enclosure defining an opening aligned with a thermopile lens.
Figure 3B:
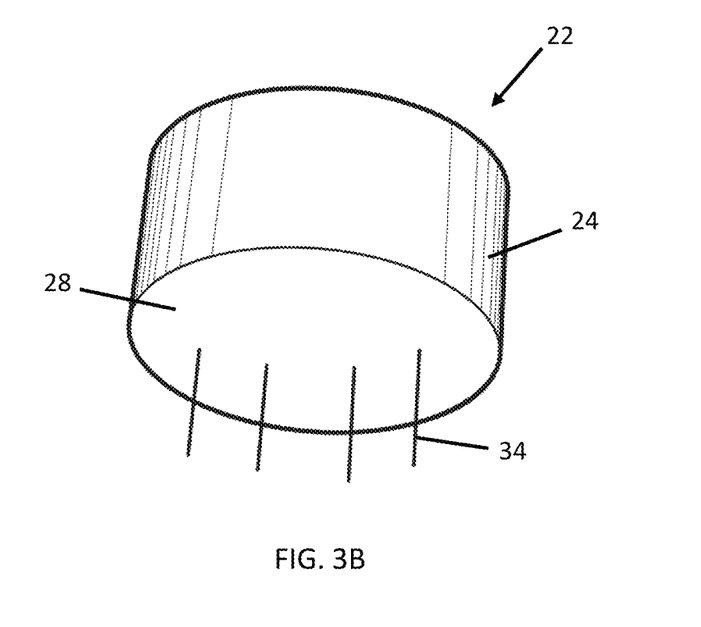
FIG. 3B is an isometric illustration of a sensing device with a particular emphasis of a second side of an enclosure through which leads emerge.

FIGS. 3A and 3B depict isometric views of a sensing device 22 which forms part of the sensor module 8. In the illustrated embodiment, sensing device 22 has a cylindrical enclosure 24 with a first side 26 and a second side 28. The first side 26 defines an opening 30 which aligns with a thermopile lens 32. From the second side 28, four electrical leads 34 emerge. The four leads 34 output signals to be received by the data acquisition unit 10. The cylindrical enclosure 24 is typically formed from a metal.

Figure 4:
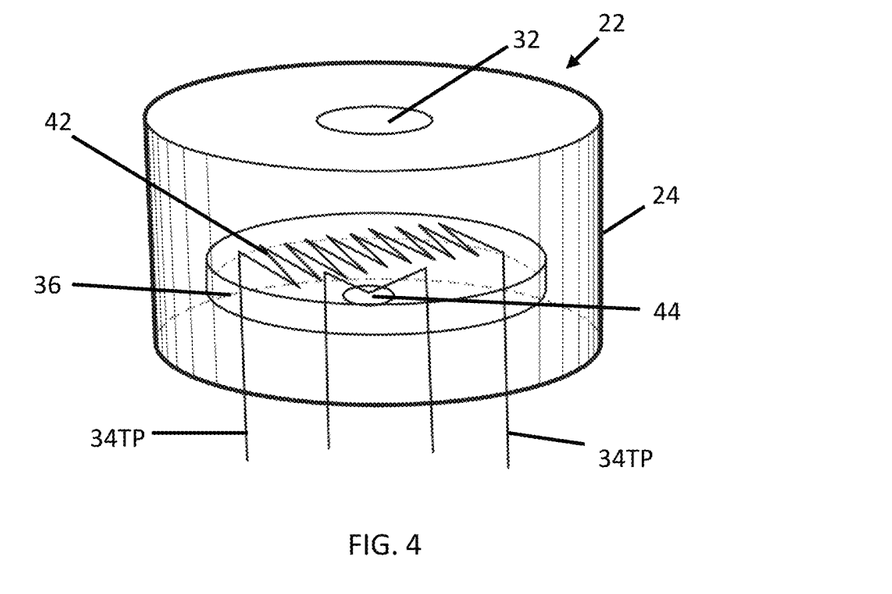
FIG. 4 is an isometric illustration of a sensing device with an enclosure in ghost to view an internal substrate having a thermopile sensor and a thermocouple sensor.
Figure 5A:
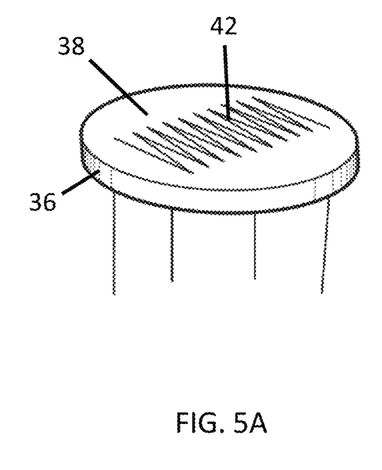
FIG. 5A is an isometric illustration of a first side of a substrate upon which a thermopile sensor is formed.

FIG. 4 depicts the sensing device 22 with the outer enclosure 24 in "ghost" so that internal components are visible. Inside enclosure 24 is a substrate 36 that is illustrated isometrically in isolation in FIGS. 5A and 5B. Substrate 36 is typically silicon. Substrate 36 has a first side 38 and a second side 40. The first and second sides of the substrate 36 generally correspond to and generally have the same orientation as the first 26 and second 28 sides of the enclosure 24 respectively. Formed upon the first side 38 of the substrate 36 is a thermopile 42 coupled to thermopile leads 34TP. In operation, thermopile 42 receives infrared light from an emitting surface through thermopile lens 32. Thermopile 42 outputs a first signal to the data acquisition unit 10 that is indicative of a temperature of the emitting surface relative to that of the substrate 36.

Figure 5B:
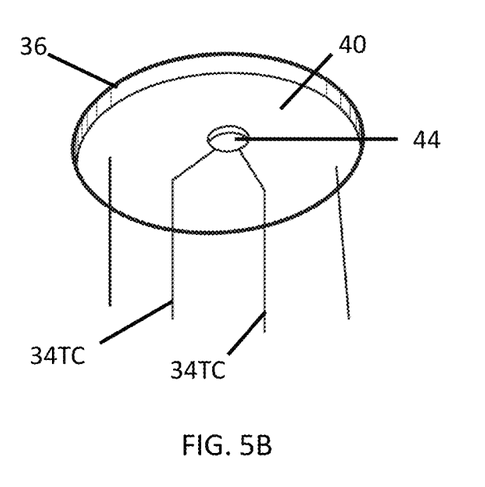
FIG. 5B is an isometric illustration of a second side of a substrate upon which a thermocouple is disposed.

Attached to the second side 40 of the substrate 36 is a temperature sensor 44. In one embodiment, the temperature sensor 44 is a thermocouple. Through the thermocouple leads 34TC, the thermocouple 44 outputs a second signal to the data acquisition unit 10 that is indicative of the temperature of the substrate 36. From the combination of the thermopile 42 and thermocouple 44 signals, the data acquisition unit 10 and/or the controller 12 can determine the temperature of the emitting surface whose infrared radiation is received by the thermopile 42.

Figure 6A:
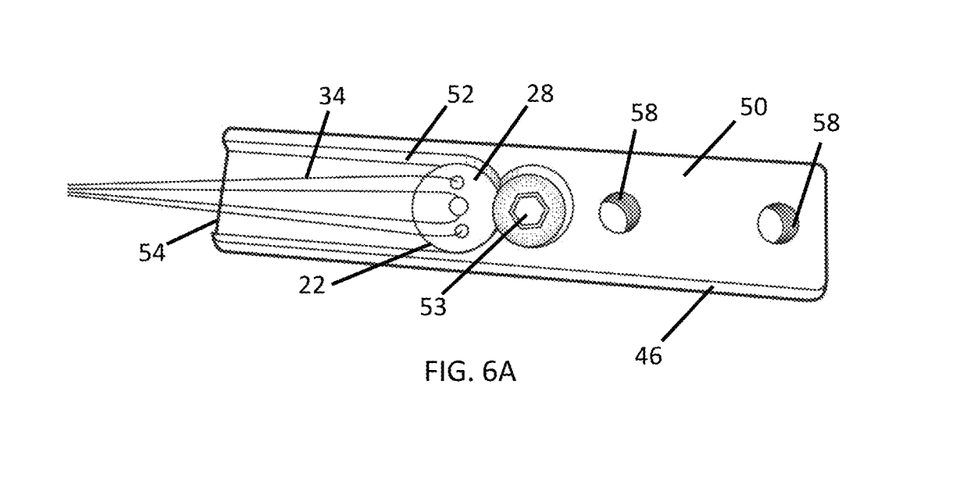
FIG. 6A is an isometric illustration of a second side of a support upon which a sensing device is mounted.
Figure 6B:
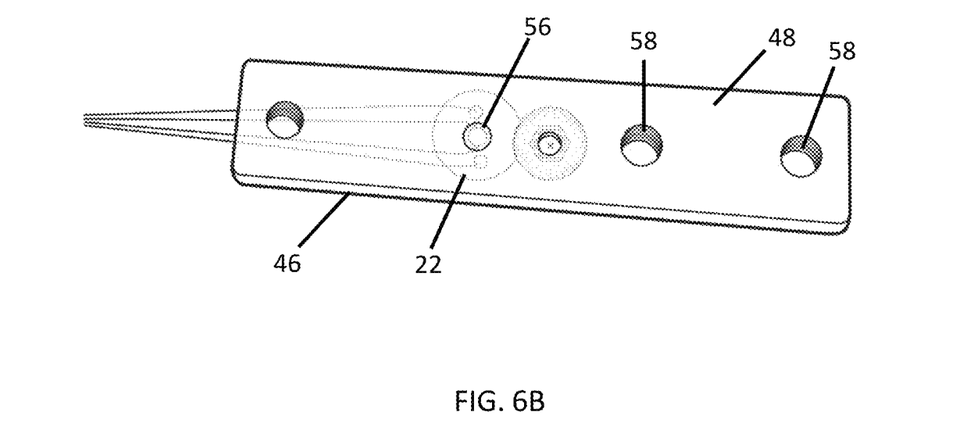
FIG. 6B is an isometric illustration of a first side of a support having an opening aligned with a thermopile lens.

FIGS. 6A and 6B illustrate opposing views of mounting of the sensing device 22 on a support 46. In the illustrative embodiment, support 46 is an aluminum block. Support 46 has a first side 48 and a second side 50. Formed into the second side 50 is a recess 52. The sensing device 22 is mounted in recess 52 with the second side 28 of enclosure 24 facing out of the recess 52. A retaining screw 53 holds the enclosure 24 in place in the recess 52. The recess 52 extends generally along a major axis of support 46 to an end 54 of support 46. The wires 34 from sensing device 22 generally extend along the recess 52.

Extending from the recess 52 to the first side 48 of support 46 is a through-hole opening 56. The enclosure 24 is mounted within the recess 52 so that the opening 30 aligns with the through-hole opening 56 to allow infrared light access to the thermopile lens 32.

The support 46 also includes two threaded openings 58 for mounting the support to the mounting component 20. The wires 34, opening 56, and threaded openings 58 are all generally arranged along the major axis of support 46.

Figure 7A:
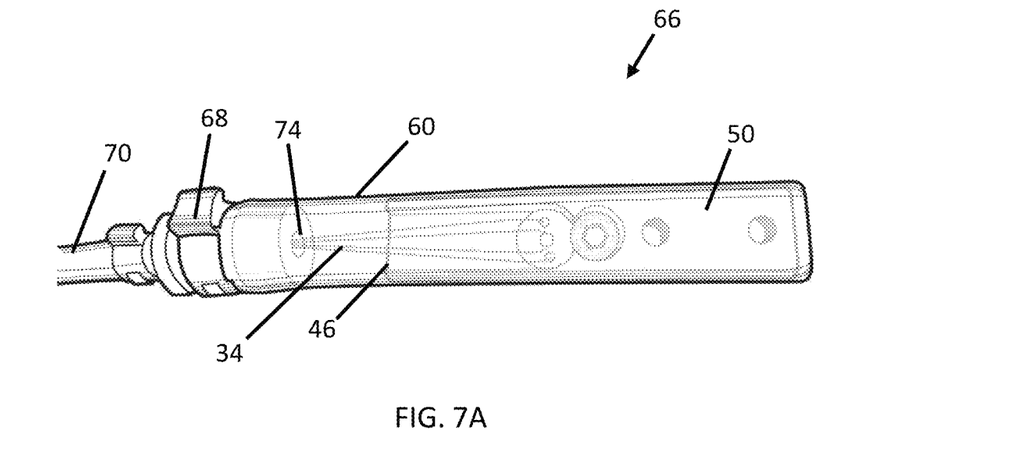
FIG. 7A is an isometric illustration of a distal end of a sensor module in which a housing surrounds a support that holds a sensing device. The view is toward a second side of the support.
Figure 7B:
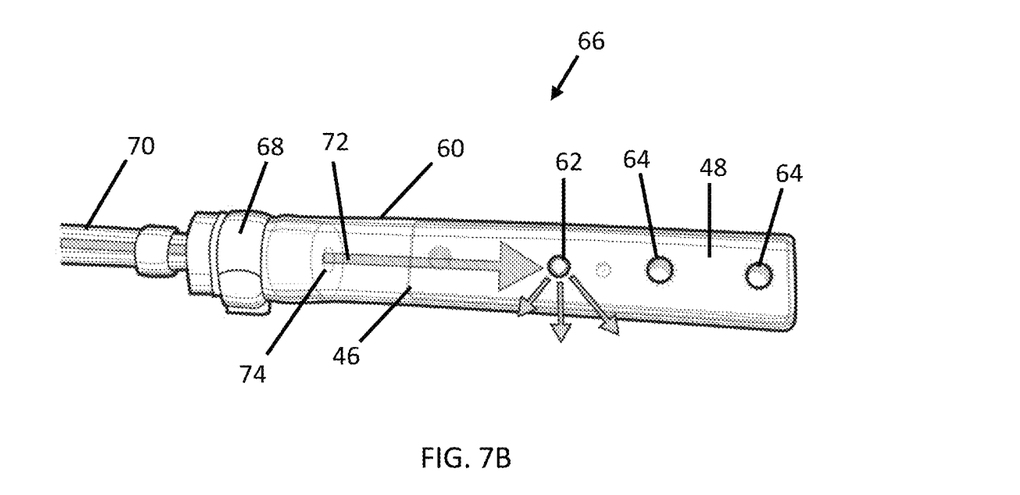
FIG. 7B is an isometric illustration of a distal end of a sensor module in which a housing that surrounds a support has an opening aligned with a thermopile lens. Also illustrated is a gas flow into the housing and out the opening in the housing. The view is toward a first side of the support.

FIGS. 7A and 7B illustratively depict opposing views of a distal end 66 of the sensor module 8 including the support 46 surrounded by an outer housing 60 that protects the sensing device 22 from contamination. In an illustrative use, the oven processing system 2 is used to reflow solder on printed circuit boards. The flux from the solder is vaporized by the reflow process and deposits on exposed surfaces. Housing 60 provides protection from the flux deposition.

FIG. 7A depicts a view of the second side 50 of support 46 within the housing 60. FIG. 7B depicts the opposing view with the first side 48 of the support 46 within the housing 60. Housing 60 defines an opening 62 that aligns with the openings 56, 30, and the thermopile lens 32. Thus, infrared light can pass through the aligned openings and to the thermopile 42.

Housing 60 also defines two openings 64 that align with the threaded openings 58 of the support 46 to allow distal end 66 of the sensor module 8 to be mounted to the mounting component 20. Attachment to the mounting component 20 has the effect of sealing both of the openings 64.

A coupler 68 attaches and seals the housing 60 to conduit 70. Conduit 70 delivers pressurized gas 72 from the source of pressurized gas 16 to the housing 60. The gas 72 from source of pressurized gas 16 travels through conduit 70, into housing 60, and out of opening 62. A steady stream of the gas 72 out of opening 62 prevents contamination such as solder flux from depositing on the thermopile lens 32.

Also shown is an opening 74 in the coupler 68 which serves two functions. The opening 74 allows the wires 34 to pass into the conduit 70 as an electrical cable. The opening 74 also allows the gas 72 to flow from the conduit 70 to the housing 60.

Figure 8:
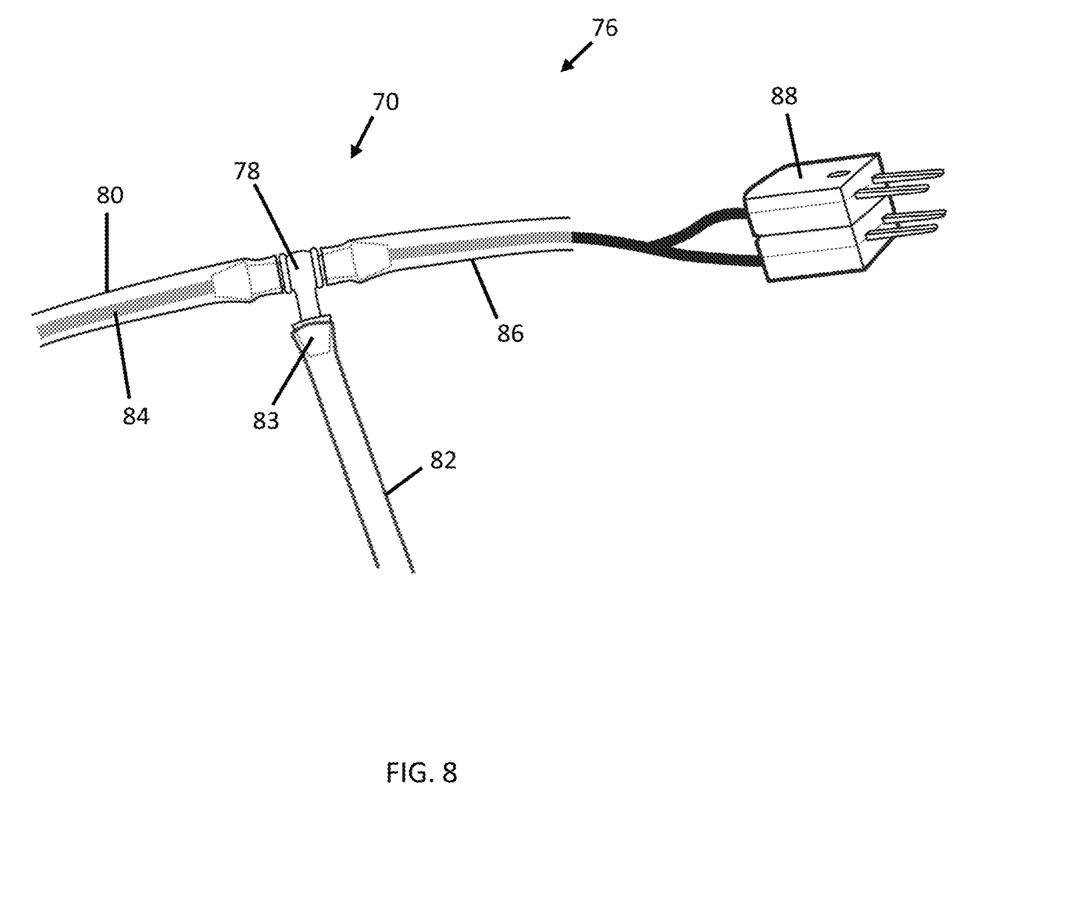
FIG. 8 is an isometric illustration of a proximal end of a sensor module including a junction at which a gas flow conduit function and an electrical cable function split off at a T-junction.

FIG. 8 is an illustrative drawing of a proximal end 76 of the sensor module 8. The gas conduit 70 includes a junction 78 that separates the gas conduit 70 into two gas carrying portions including a first conduit portion 80 that couples to the housing 60 and a second conduit portion 82 that couples to the source of pressurized gas 16. In the illustrative embodiment, the junction 78 is a T-junction 78 whereby incoming gas arriving from second conduit portion 82 is diverted 90 degrees and into first conduit portion 80 before passing to the housing 60. At the T-junction 78, the conduit portions 80 and 82 are attached to barbed fitments 83.

Also depicted is electrical cable 84 that couples leads 34 to the data acquisition unit 10. The electrical cable 84 passes through the first gas conduit 80 to the junction 78 and then continues to electrical conduit 86 and finally to the data acquisition unit 10. Electrical cable 84 includes a four lead electrical plug 88 for coupling to the data acquisition unit 10. Thus, the cable passes through the first gas conduit portion 80 but not through the second gas conduit portion 82.

Figure 9:
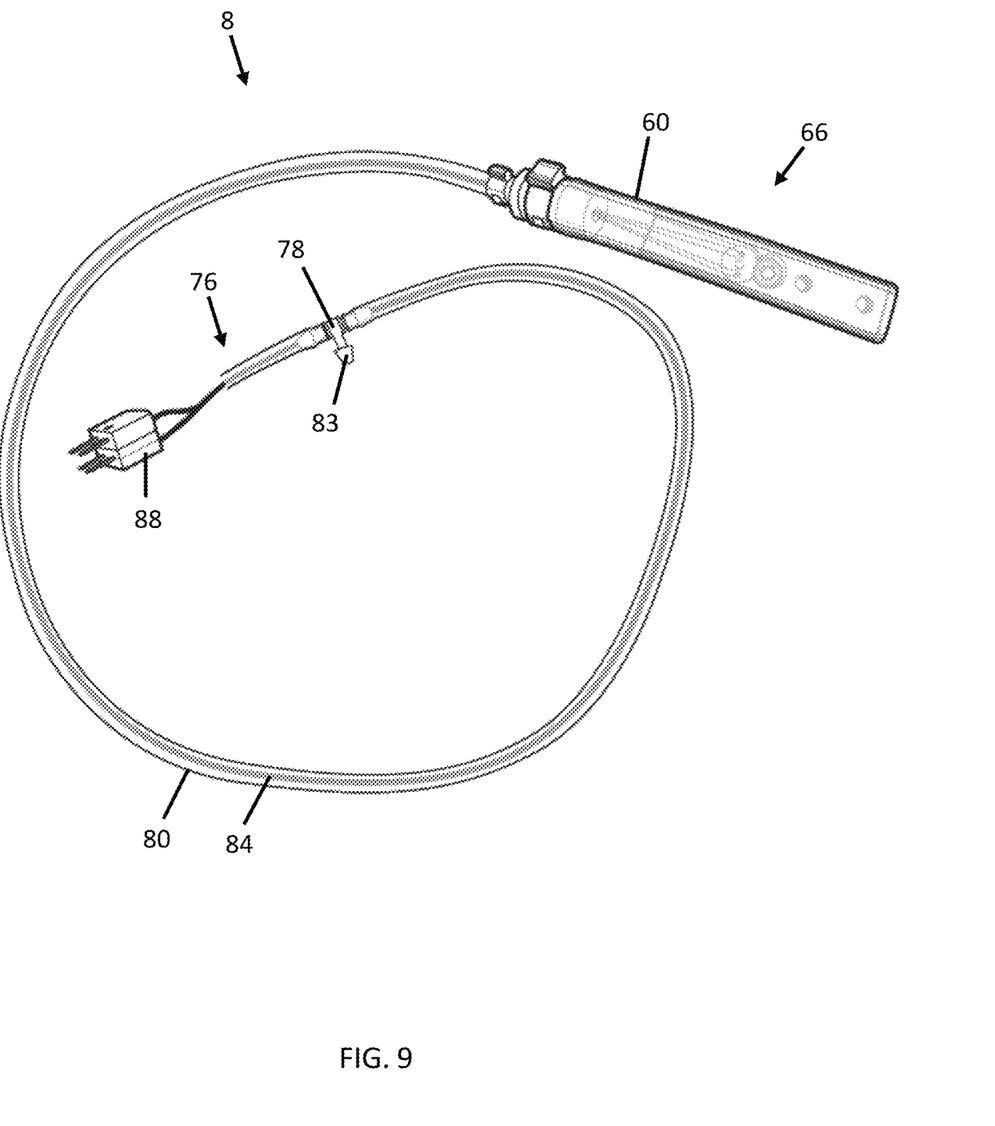
FIG. 9 is an isometric illustration of an embodiment of a sensor module.

FIG. 9 is an illustrative embodiment of the sensor module 8. As can be seen, sensor module 8 is an elongate and mostly tubular component. Most of the length of sensor module 8 is the first conduit portion 80 that extends from the proximal portion 76 to the distal portion 66. The length of the first conduit portion 80 allows for a physical and spatial separation between temperature sensitive sensor electronics (the data acquisition unit) 10 and the temperature insensitive distal portion 66. The distal portion 66 can be placed in the heated tunnel of the oven 4 while the proximal portion 76 coupled to the sensor electronics 10 can be placed outside the heated tunnel. The first conduit portion 80 can be routed along an edge of the conveyor belt 6 between a mounting location of the distal end 66 and the sensor electronics 10.

Figure 10:
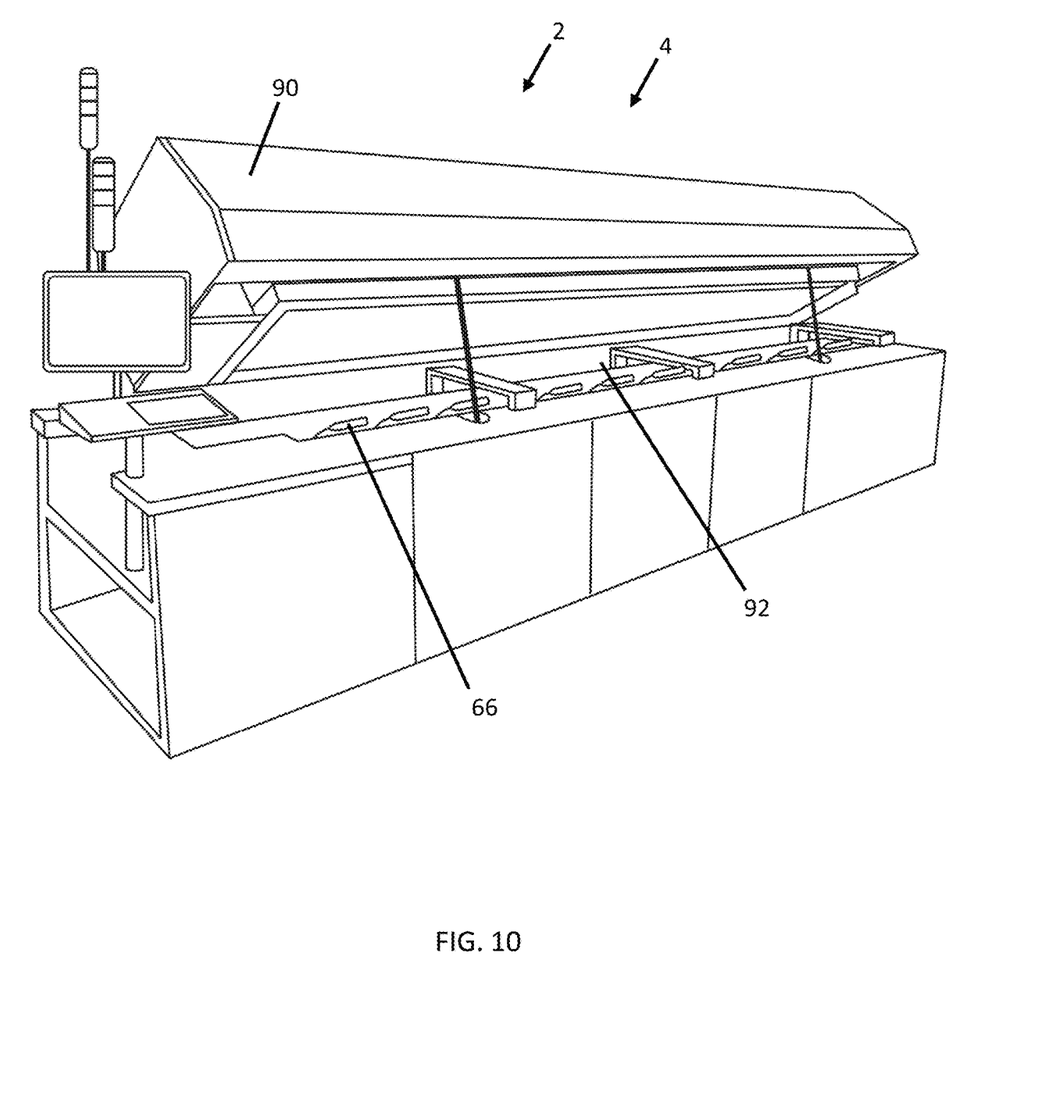
FIG. 10 is an isometric illustration of an oven processing system with nine sensor modules installed. In this view, a top lid of the oven is open.

FIG. 10 is an isometric illustration of an oven processing system 2. In the illustrated embodiment, nine sensor modules 8 are used to a monitor surface of objects passing through the oven 4. In the illustrated embodiment, the oven 4 has a lid 90 that is raised to reveal the distal ends 66 of the nine sensor modules 8. When the lid 90 is closed, a heated tunnel 92 is defined through which the conveyor belt 6 (not shown here) passes along the first direction X. While nine sensor modules 8 are illustrated, any practical number can be employed. In some ovens 4 there can be 12 or more sensors. Some ovens 4 will have both heating and cooling zones. There are various embodiments of ovens and quantities of sensor modules 8 that fall within the scope of the disclosure.

Figure 11:
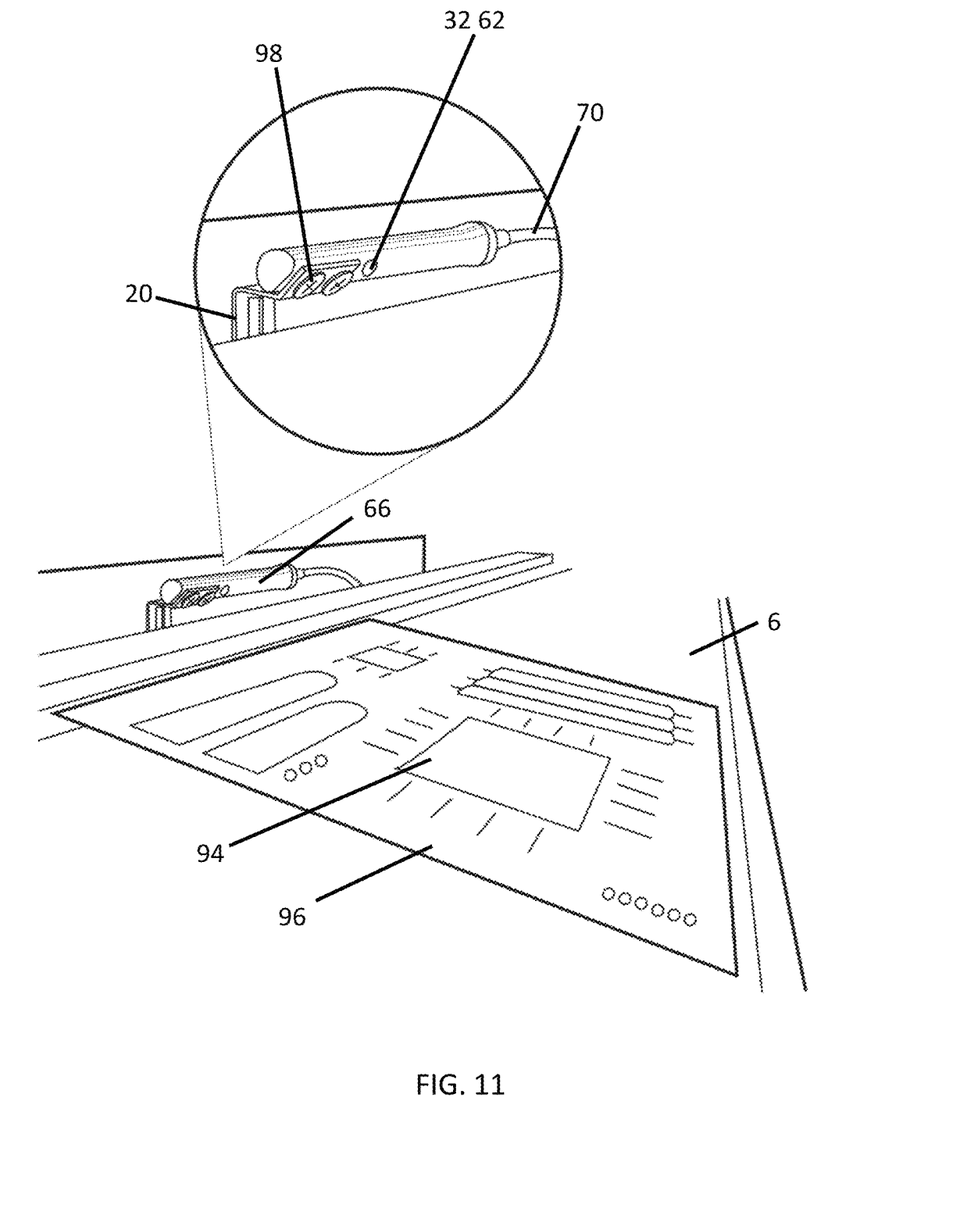
FIG. 11 is an isometric illustration a distal end of a sensor module installed adjacent to a conveyor belt with an object surface temperature being monitored.

FIG. 11 is an illustration depicting an upper surface 94 of a printed circuit board 96 being transported by the conveyor belt 6. The distal end 66 of a sensor module 8 is shown mounted adjacent to the conveyor belt 6.

Two screws 98 are shown coupling the mounting component 20 to the threaded openings 58. This method of mounting provides a dual function of supporting the support 46 above the conveyor belt 6 in sealing the openings 64 in housing 60. The major axis of the support 46 is mounted so that is generally in alignment with the first direction X of motion of the conveyor belt 6.

The distal end 66 is mounted so that an optical axis of the thermopile lens 32 is generally aligned downwardly and along the transverse axis Y so as to receive infrared light from the upper surface 94 of the printed circuit board 96. During operation, gas 71 flows out of opening 62 to prevent solder flux from the circuit board 96 from contaminating and fouling the thermopile lens 32.

Figure 12:
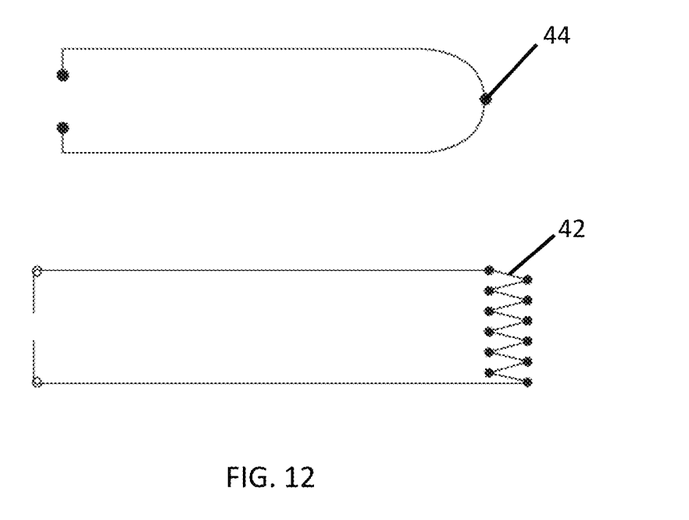
FIG. 12 is a diagram of two sensors including a thermocouple and a thermopile.
Figure 13:
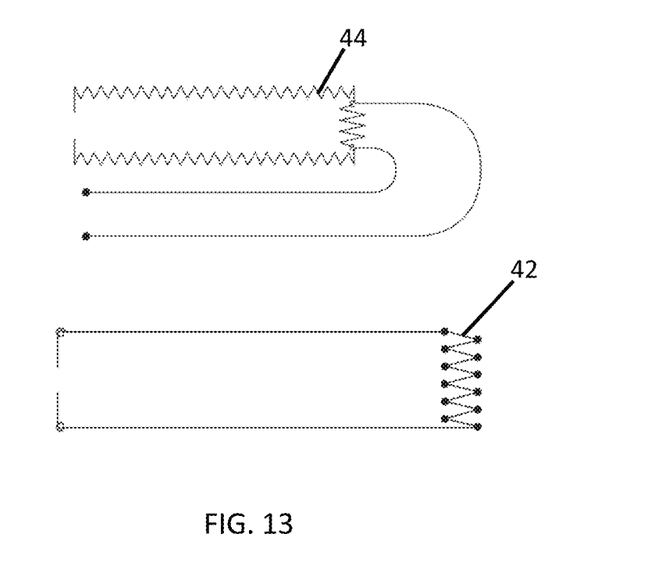
FIG. 13 is a diagram of two sensors including a thermistor and a thermopile.

FIGS. 12 and 13 depicts two different alternatives for sensors 42 and 44. For both alternatives, the sensor 42 is a thermopile. For the embodiment of FIG. 12, the sensor 44 is a thermocouple 44. FIG. 13 is an alternative embodiment in which the sensor 44 is a thermistor. The embodiment of FIG. 12 is a preferred embodiment because it limits the number of wires that need to be routed along the sensor modules 8 to just four wires per module 8. The thermistor embodiment of FIG. 13 requires six wires per module 8.

Figure 14:
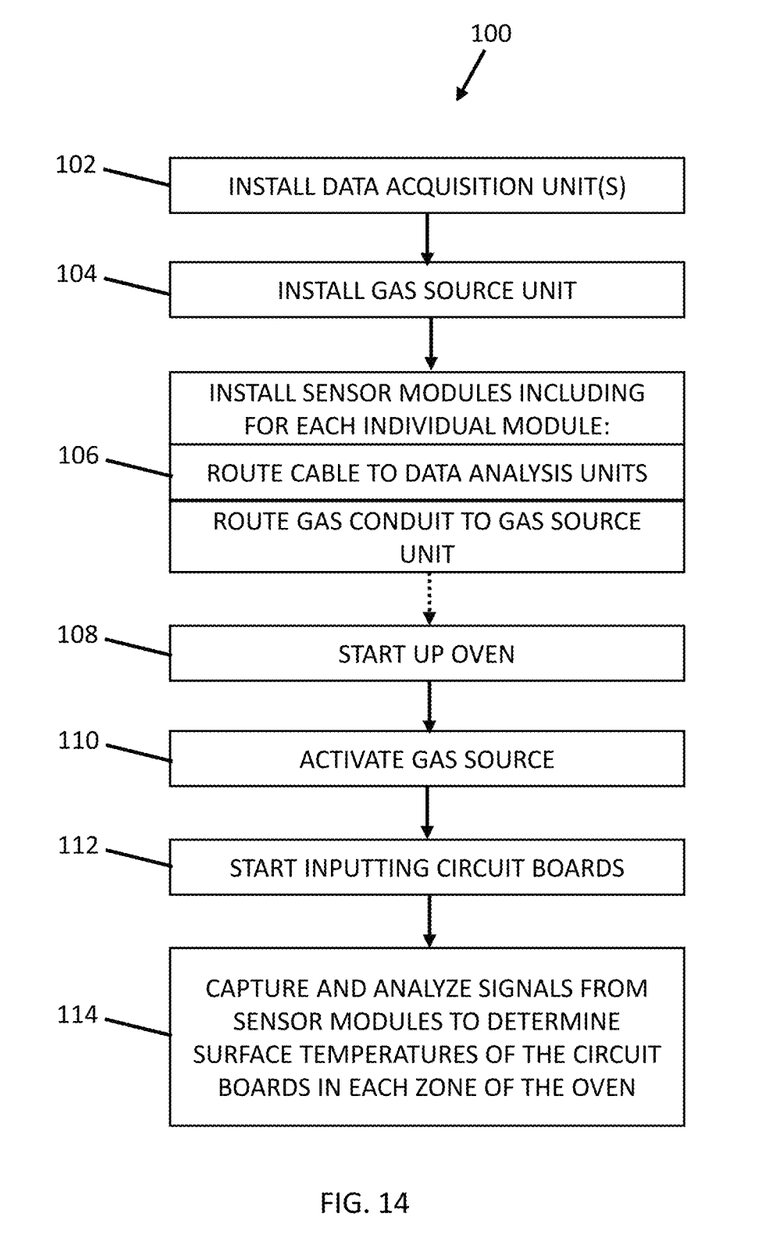
FIG. 14 is a flowchart depicting a method of manufacturing including installing the retrofit kit of FIG. 2 and a method of operating the retrofitted oven.

FIG. 14 depicts an embodiment of a method of manufacturing 100. A first group of steps 102 to 106 are for retrofitting the oven processing system 2 with kit 18. A second group of steps 108 to 114 are for manufacturing circuit boards as the retrofit provides monitoring of the surface temperatures of objects being processed.

According to 102, the data acquisition unit(s) 10 is/are installed on system 2. According to 104, the source of pressurized gas 16 is installed. According to 106, the sensor modules 8 are installed.

For individual sensor modules 8: The distal end 66 of sensor module 8 is mounted in position to monitor surface temperatures of the processed objects. The first conduit portion 80 of conduit 30 is then routed generally along and to the side of the conveyor belt 6. The second conduit portion 82 is routed and coupled to the source of pressurized gas 16. The electrical cable 84 is routed from the junction 78 and coupled to the data acquisition unit 10.

According to 108, the oven 4 is started and warmed up to an operating temperature. According to 110 the source of pressurized gas 16 is activated so that gas 72 flows out of source of pressurized gas 16, along conduit 70, and out of opening 62. According to 112, objects such as printed circuit boards are inputted to the conveyor belt 6. According to 114, the data acquisition unit and controller capture and analyze signals from the sensors 42 to determine surface temperatures of the objects being processed.

Different orderings of steps are possible. For example, steps 102 and 104 can be performed after partially installing the sensor modules 8. It may be desirable to activate the source of pressurized gas 110 before starting up the oven 4. Any and all possible viable of different orderings of steps and sensor module embodiments are possible except as limited by the claims.

The specific embodiments and applications thereof described above are for illustrative purposes only and do not preclude modifications and variations encompassed by the scope of the following claims.

What is claimed:

1. An oven processing system comprising:
    an oven having a heated tunnel passing laterally therethrough;
    a conveyor belt that travels laterally through the heated tunnel along a first axis;
    a measurement system including:
        a plurality of sensor modules individually including:
            an enclosure containing a substrate and a thermopile lens, the substrate having a first side and a second side, the first side having a thermopile configured to output a first signal indicative of a surface temperature of an object on the conveyor belt relative to the substrate, the second side having a temperature sensor configured to output a second signal indicative of a temperature of the substrate, the thermopile lens overlying the thermopile and aligned with an opening in the enclosure;
            a housing enclosing the enclosure and including an opening aligned with the thermopile lens to allow infrared light from the object to reach the thermopile;
            a gas conduit coupled to the housing; and
            an electrical cable coupled to the substrate;
        a data acquisition unit coupled to the electrical cable that receives the first and second signals from the sensor modules and outputs information indicative of a surface temperature of the object; and
        a source of pressurized gas coupled to the gas conduit whereby gas flows through the conduit, to the housing, and out the opening in the housing, the flow through the opening preventing an accumulation of contaminants upon the thermopile lens.

2. The system of claim 1 wherein a distal end of a sensor module is mounted adjacent to an edge of the conveyor belt within the tunnel of the oven with the thermopile lens generally facing toward an upper surface of the conveyor belt.

3. The system of claim 1 wherein the sensor modules individually include a support upon which the enclosure is mounted, the support including mounting features for mounting one end of the sensor module to a location adjacent to an edge of the conveyor belt, the housing surrounding the support.

4. The system of claim 3 wherein the support has a long axis and is mounted adjacent to an edge of the conveyor belt with the long axis generally aligned with the first axis.

5. The system of claim 1 wherein the electrical cable passes through at least a portion of the gas conduit.

6. The system of claim 1 wherein the gas conduit has a junction that couples a first conduit portion that is coupled to the housing, a second conduit portion coupled to the source of gas, and the cable which passes from the housing, through the first conduit portion but not through the second conduit portion.

7. A method of retrofitting an oven processing system having an oven defining a lateral heated tunnel and having a conveyor belt that travels through the heated tunnel along a first lateral axis, the method including:
    mounting a plurality of sensor modules in the oven processing system, the sensor modules individually including:
        an enclosure containing a substrate and a thermopile lens, the substrate having a first side and a second side, the first side having a thermopile configured to output a first signal indicative of a surface temperature of an object on the conveyor belt relative to the substrate, the second side having a temperature sensor configured to output a second signal indicative of a temperature of the substrate, the thermopile lens overlying the thermopile and aligned with an opening in the enclosure;
        a housing enclosing the enclosure and including an opening aligned with the thermopile lens to allow infrared light from the object to reach the thermopile;
        a gas conduit coupled to the housing; and
        an electrical cable coupled to the substrate;
    coupling the electrical cable to a data acquisition unit; and
    coupling the gas conduit to a source of pressurized gas, activating the source of pressurized gas causes a flow of gas through the gas conduit and out of the opening in the enclosure to prevent gas-borne contamination from accumulating on the thermopile lens.

8. The method of claim 7 wherein mounting the plurality of sensor modules individually includes mounting a distal end of the sensor module which includes the enclosure and housing to a location adjacent to an edge of the conveyor belt within the lateral tunnel with the thermopile lens generally facing towards an upper surface of the conveyor belt.

9. The method of claim 7 wherein the sensor modules individually include a support upon which the enclosure is mounted, the support including a mounting feature, the method including attaching the mounting feature to a mounting component.

10. A kit for retrofitting an oven processing system, the oven processing system including an oven defining a heated tunnel passing laterally therethrough and a conveyor belt that travels laterally through the heated tunnel along a first axis, the kit including:

a plurality of sensor modules individually including:

an enclosure containing a substrate and a thermopile lens, the substrate having a first side and a second side, the first side having a thermopile configured to output a first signal indicative of a surface temperature of an object on the conveyor belt relative to the substrate, the second side having a temperature sensor configured to output a second signal indicative of a temperature of the substrate, the thermopile lens overlying the thermopile and aligned with an opening in the enclosure;

a housing enclosing the enclosure and defining an opening aligned with the thermopile lens to allow infrared light from the object to reach the thermopile;

a gas conduit coupled to the housing; and an electrical cable coupled to the substrate.

11. The kit of claim 10 wherein the sensor modules individually include a support upon which the enclosure is mounted, the support contained within the housing.

12. The kit of claim 11 wherein the support has a first and second side corresponding to the first second sides of the substrate, the second side defines a recess for receiving the first side of the enclosure, the support defines an opening that passes from the recess to the first side that aligns with the thermopile lens.

13. The kit of claim 12 wherein a plurality of wires couple the substrate to the electrical cable and route along the recess along a major axis of the support.

14. The kit of claim 12 wherein the support includes at least one mounting hole, the housing defines a corresponding mounting hole in alignment with the mounting hole of the support.

15. The kit of claim 10 wherein the gas conduit includes a first portion that extends between the housing and a junction, the electrical cable passes through the first portion of the gas conduit.

16. The kit of claim 15 wherein the gas conduit has a second portion that extends from the junction to be connected to a source of pressurized gas, the cable does not pass through the second portion.

17. The kit of claim 15 wherein the junction is a T-junction.

18. The kit of claim 17 wherein a second portion of the gas conduit extends at about 90 degrees from the first portion of the gas conduit from the T junction.

19. The kit of claim 17 wherein the cable extends from the T-junction in a direction generally along the direction of the first conduit.

* * * * *